United States Patent [19]

Bandoh

[11] Patent Number: 5,750,059
[45] Date of Patent: May 12, 1998

[54] METHOD OF MOLDING RESIN TO SEAL ELECTRONIC PARTS

[75] Inventor: Kazuhiko Bandoh, Kyoto, Japan

[73] Assignee: Towa Corporation, Uji, Japan

[21] Appl. No.: 268,849

[22] Filed: Jun. 29, 1994

[30] Foreign Application Priority Data

| Jul. 22, 1993 | [JP] | Japan | 5-202689 |
| Jul. 22, 1993 | [JP] | Japan | 5-202690 |
| Dec. 14, 1993 | [JP] | Japan | 5-343141 |

[51] Int. Cl.$^6$ ............... B29C 33/30; B29C 45/02
[52] U.S. Cl. .......... 264/39; 264/161; 264/272.14; 264/272.15; 425/185; 425/190
[58] Field of Search ............ 264/39, 161, 272.13, 264/272.15, 272.17, 275, 272.14; 425/183, 190, 185, 186

[56] References Cited

U.S. PATENT DOCUMENTS

| 4,368,168 | 1/1983 | Slepcevic | 264/272.15 |
| 4,374,080 | 2/1983 | Schroeder | 264/272.17 |
| 4,442,056 | 4/1984 | Slepcevic | 264/272.14 |
| 4,513,942 | 4/1985 | Creasman | 264/272.14 |
| 5,110,515 | 5/1992 | Nakamura et al. | |
| 5,116,450 | 5/1992 | Spoo et al. | 425/185 |
| 5,200,125 | 4/1993 | Osada | 264/272.11 |
| 5,302,103 | 4/1994 | Brown et al. | 425/190 |
| 5,316,463 | 5/1994 | Neu | 425/184 |
| 5,405,255 | 4/1995 | Neu | 425/183 |
| 5,409,362 | 4/1995 | Neu | 425/184 |
| 5,429,488 | 7/1995 | Neu | 425/184 |
| 5,454,705 | 10/1995 | Back | 425/183 |

FOREIGN PATENT DOCUMENTS

| 0202701 | 11/1986 | European Pat. Off. |
| 0428792 | 5/1991 | European Pat. Off. |
| 0594863 | 5/1994 | European Pat. Off. |
| 3328408 | 5/1985 | Germany |
| 4204286 | 8/1993 | Germany |
| 58-128744 | 8/1983 | Japan |
| 59-207635 | 11/1984 | Japan |
| 59-220931 | 12/1984 | Japan |
| 60-227426 | 11/1985 | Japan |
| 61-148016 | 7/1986 | Japan |
| 61-263229 | 11/1986 | Japan |
| 63-240035 | 10/1988 | Japan |
| 4-43653 | 2/1992 | Japan |
| 2032334 | 5/1980 | United Kingdom |
| 2158003 | 11/1985 | United Kingdom |
| WO91/08095 | 6/1991 | WIPO |

OTHER PUBLICATIONS

Martin T. Goosey Plastics for Electronics, Elsevier Applied Science Publishers Ltd. 1985, pp. 137–147.

Hanns Benninghoff, Die Spritzgiessmaschine Im Zeitalter Von Computer Und Roboter, Technische Rundschau, 1989 vol. 26, pp. 36+37.

Primary Examiner—Angela Y. Ortiz
Attorney, Agent, or Firm—W. G. Fasse; W. F. Fasse

[57] ABSTRACT

A method of and an apparatus for molding resin to seal electronic parts are adapted to use molding units to seal with molded resin materials electronic parts that are mounted on lead frames. Additional molding units are detachably mounted with respect to an already provided first molding unit in the molding apparatus, so that the number of the molding units can be arbitrarily adjusted. In this manner, the method and apparatus can be easily reconfigured or rearranged to be adapted to mass production or small production runs of the same or different types of molded parts. By simultaneously carrying out various process steps, the overall process time is reduced.

18 Claims, 7 Drawing Sheets

METHOD OF MOLDING RESIN TO SEAL ELECTRONIC PARTS

BACKGROUND OF THE INVENTION

1. Field of the Invention

The present invention relates to a method of and an apparatus for molding resin to seal electronic parts, such as ICs, LSIs, diodes or capacitors which are mounted on lead frames with a resin material.

2. Description of the Background Art

In general, electronic parts are sealed with molded resin by transfer molding, through a resin molding/sealing apparatus having the following basic structure and operation.

Such a resin molding/sealing apparatus comprises a mold having fixed and movable mold sections which are opposed to each other, resin material supply pots arranged in the mold, plungers mounted on the pots for pressurizing resin, cavities provided in mold surfaces of the fixed and movable mold sections respectively to face each other, and resin passages provided between the pots and the cavities.

Resin tablets are supplied in the pots while electronic parts mounted on lead frames are supplied and set in prescribed positions of the cavities, and the mold is closed. The resin tablets provided in the pots are heated and pressurized so that the resin materials melted in the pots are injected and charged into the cavities provided on side positions of the pots through the resin passages respectively. Thus, the resin is molded to seal the electronic parts engaged in the cavities respectively.

When a mold for mass production is employed for the aforementioned apparatus, this leads to the following problems. For example, the mold for mass production is inevitably increased in weight and size, and is hard to handle while it is difficult to maintain the mold in uniform working accuracy. Thus, portions of the mold differ from each other in resin molding conditions. Particularly in manufacturing products such as electronic parts that are to be sealed with molded resin with requirements for high quality and high reliability, the cavities may be partially charged with no resin, or voids or defective parts may be formed in the interior and the exterior of the sealed compacts due to such difference in resin molding/sealing conditions, to extremely reduce the quality of the products. In order to maintain the mold in uniform accuracy, further, the mold and the apparatus are increased in cost.

Further, resin flashes adhere to the mold surfaces in such a large quantity that the overall molding time is increased since it takes time to remove the resin flashes, leading to extreme reduction of productivity.

In addition, a mold for mass production that is to be mounted on the aforementioned conventional apparatus is inevitably restricted in size and production quantity since it is necessary to also take the size of a mold closing mechanism or the like into consideration in this case.

The mold provided in the aforementioned conventional apparatus is generally adapted to simultaneously mold the same type of compacts. In order to mold different types of compacts, therefore, it is necessary to exchange the mold which is mounted on the molding apparatus itself. In order to simultaneously mold different types of compacts by the same molding apparatus, further, it is necessary to change the layout of the mold itself or to simultaneously mount different types of molds on the apparatus.

When the mold which is mounted on the molding apparatus itself is frequently changed for molding different types of compacts, however, the mold exchange operation is troublesome and reduces productivity. When the layout of the mold which is mounted on the molding apparatus itself is changed to be capable of simultaneously molding different types of compacts, the design of the mold is complicated and the usage of the mold is restricted to the layout, leading to inferiority in general and increased cost for the mold and the molding apparatus.

When a plurality of molds of different types are simultaneously mounted on the molding apparatus, the molds themselves must be miniaturized due to restriction of spaces for receiving the same, leading to complicated design of the molds and reduction in productivity. If a plurality of molding apparatuses are employed independently of each other in correspondence to the number of different types of compacts for solving this problem, for example, the cost for the production equipment is disadvantageously increased.

In a conventional method of molding resin to seal electronic parts, on the other hand, a step of supplying unsealed lead frames into prescribed positions of cavities provided in a mold, a step of supplying resin tablets into pots provided in the mold, a step of taking out the sealed lead frames from the mold to the exterior thereof, and a step of cleaning mold surfaces of the mold after resin molding/sealing are generally successively carried out independently of each other.

In such a conventional method of molding resin to seal electronic parts, therefore, the overall molding time is so increased that productivity is extremely reduced.

SUMMARY OF THE INVENTION

An object of the present invention is to provide a method of and an apparatus for molding resin to seal electronic parts, which can simply cope with varied production of small and large quantities of electronic parts to be sealed with molded resin, for molding products with high quality and high reliability with neither voids nor defective parts formed in the interior and the exterior of the sealed compacts.

Another object of the present invention is to provide a method of and an apparatus for molding resin to seal electronic parts, which can simply cope with simultaneous production of different types of compacts for molding the products with high quality and high reliability.

Still another object of the present invention is to provide a method of molding resin to seal electronic parts that can produce sealed compacts of electronic parts with high efficiency by reducing the overall time for molding resin to seal the electronic parts.

In order to attain the aforementioned objects, a method of molding resin to seal electronic parts according to a first aspect of the present invention is adapted to seal electronic parts that are mounted on lead frames with a molded resin material, using molding units each having a mold, resin supply pots arranged in the mold, resin pressurizing plungers provided on the pots, cavities provided in mold surfaces of the mold, and resin passages provided between the cavities and the pots. According to this method, the number of the molding units is adjusted by detachably mounting an additional molding unit with respect to a first molding unit that is already provided on an apparatus for molding resin to seal electronic parts. Thereafter unsealed lead frames having electronic parts mounted thereon and resin tablets are supplied to each molding unit. Then, the electronic parts are sealed with molded resin through each molding unit, and are thereafter taken out from the same to the exterior.

According to this method, it is possible to utilize the apparatus in a configuration having minimum forming units for molding resin to seal electronic parts, while it is also possible to utilize the apparatus in a configuration having a plurality of forming units by simply detachably combining an additional molding unit with the minimum forming units.

Therefore, it is possible to simply form an apparatus for molding resin to seal electronic parts which is responsive to mass production without increasing the size of the mold itself. Further, it is also possible to simply form an apparatus for molding resin to seal electronic parts which can cope with small production runs without increasing the size of the mold itself since the additional molding unit can be properly detached.

Namely, it is possible to arbitrarily and simply adjust the number of the molding units provided on the molding apparatus in response to the production quantity as required. Thus, it is possible to readily cope with small production runs and mass production runs as needed for molding resin to seal electronic parts.

According to this method, further, it is possible to simply form an apparatus for molding resin to seal electronic parts which is responsive to mass production without increasing the size of the mold itself, whereby products having high quality and high reliability can be produced with high efficiency with neither voids nor defective parts formed in the interior and the exterior of sealed compacts of electronic parts.

In a preferred embodiment, respective steps of the method of molding resin to seal electronic parts according to the first aspect of the present invention are carried out as follows.

In a step of supplying unsealed lead frames having electronic parts mounted thereon and resin tablets to each molding unit, a number of unsealed lead frames having electronic parts mounted thereon are supplied to and set in prescribed positions of a lead frame supply unit and thereafter transferred to a lead frame aligning unit to be aligned with each other along a prescribed direction. After a prescribed number of resin tablets are supplied into a resin tablet discharge unit and aligned with each other, the unsealed lead frames and the resin tablets are transferred to a clearance between fixed and movable mold sections provided in the molding unit, so that the unsealed lead frames and the resin tablets are supplied into prescribed positions of cavities and pots provided in the molding unit respectively.

In a step of molding resin to seal the electronic parts, the fixed and movable mold sections are closed while the resin tablets provided in the pots are heated and pressurized to be melted so that molten resin materials are injected into and charged in the cavities through resin passages, to be molded for sealing the electronic parts that are engaged in the cavities.

In a step of removing or taking out the sealed electronic parts from each molding unit to the exterior, the lead frames sealed through the aforementioned molding/sealing step are taken out from the fixed and movable mold sections to the exterior, while mold surfaces of the fixed and movable mold sections are cleaned. Thereafter the sealed lead frames are transferred to a position of a degating unit, where the gate portions are removed from the same. Thereafter the sealed lead frames are transferred to a lead frame storage unit, to be picked up independently of each other and stored in the storage unit.

In a more preferred embodiment of the method of molding resin to seal electronic parts according to the first aspect of the present invention, the already provided molding unit and another molding unit are adapted to mold resin for sealing different types of electronic parts, so that different types of products are simultaneously sealed with molded resin in parallel with each other through these molding units.

According to this method, it is possible to couple molding units with each other in response to the number of different types of products, for simultaneously sealing the respective types of products in parallel with each other. Thus, it is possible to efficiently cope with mass production of a number of types of electronic parts.

A method of molding resin to seal electronic parts according to a second aspect of the present invention comprises a step of supplying unsealed lead frames, a step of supplying resin tablets, a step of closing upper and lower mold sections, a step of molding resin to seal the electronic parts, and a step of taking out the sealed lead frames, as well as a step of cleaning respective mold surfaces of the upper and lower mold sections. The feature of this method resides in that the steps of cleaning the mold surfaces, supplying unsealed lead frames and supplying the resin tablets are simultaneously carried out in parallel with the step of taking out the sealed lead frames.

According to this method, the step of cleaning the mold surfaces is carried out with the step of taking out the sealed lead frames, while the steps of supplying unsealed lead frames and the resin tablets are also carried out at the same time. Thus, it is possible to carry out the steps of taking out the sealed lead frames and cleaning the mold surfaces in parallel with each other, while it is also possible to carry out the steps of supplying unsealed lead frames to be subsequently sealed and supplying the resin tablets in parallel with each other. Consequently, a waiting time for successive operations for molding resin to seal electronic parts is reduced, whereby it is possible to reduce the overall molding time.

In a preferred embodiment of the method of molding resin to seal electronic parts according to the second aspect of the present invention, respective steps are carried out as follows. In a step of taking out sealed lead frames, an unloader unit is advanced into a clearance between upper and lower mold sections to engage with the sealed lead frames, and then retracted in this state to take out the sealed lead frames to the exterior of the upper and lower mold sections.

In a step of supplying unsealed lead frames, on the other hand, a loader unit is advanced into the clearance between the upper and lower mold sections when the unloader unit is retracted, to supply unsealed lead frames into prescribed positions of cavities provided in the upper and lower mold sections.

In a step of supplying resin tablets, the loader unit is advanced into the clearance between the upper and lower mold sections when the unloader unit is retracted, to supply the resin tablets into pots. In a step of cleaning mold surfaces, a cleaner unit is moved along the clearance between the upper and lower mold sections, to clean the mold surfaces thereof.

According to this method, it is also possible to carry out the steps of supplying unsealed lead frames and the resin tablets simultaneously with the advancement of the loader unit into the clearance between the upper and lower mold sections.

It is also possible to carry out the step of cleaning the mold surfaces with the cleaner unit when the unloader unit is retracted.

Further, the step of cleaning the mold surfaces may be simultaneously carried out in parallel with the step of taking out the sealed lead frames.

The step of cleaning the mold surfaces may be carried out by retracting the cleaner unit which is mounted on the unloader unit during retraction of the unloader unit in the step of taking out the sealed lead frames.

An apparatus for implementing the method of molding resin to seal electronic parts according to the first aspect of the present invention comprises a molding unit, a mechanism for supplying unsealed lead frames having electronic parts mounted thereon and resin tablets to the molding unit, and a mechanism for taking out the electronic parts as sealed from the molding unit to the exterior. The feature of this apparatus resides in that another molding unit can be detachably mounted with respect to the already provided molding unit, so that the number of the molding units can be increased or decreased as needed.

An apparatus for implementing the method of molding resin to seal electronic parts according to the second aspect of the present invention comprises a molding unit, an unsealed lead frame supply mechanism, a resin tablet supply mechanism, a mold closing mechanism and a mechanism for taking out sealed lead frames as well as a mold surface cleaning mechanism for cleaning respective mold surfaces of a mold. The resin tablet supply mechanism is formed to interlock with the mechanism for taking out sealed lead frames, so that unsealed lead frames can be supplied simultaneously with the operation for taking out sealed lead frames.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS AND OF THE BEST MODE OF THE INVENTION

An embodiment of the present invention is now described with reference to the drawings.

Figure 1A:
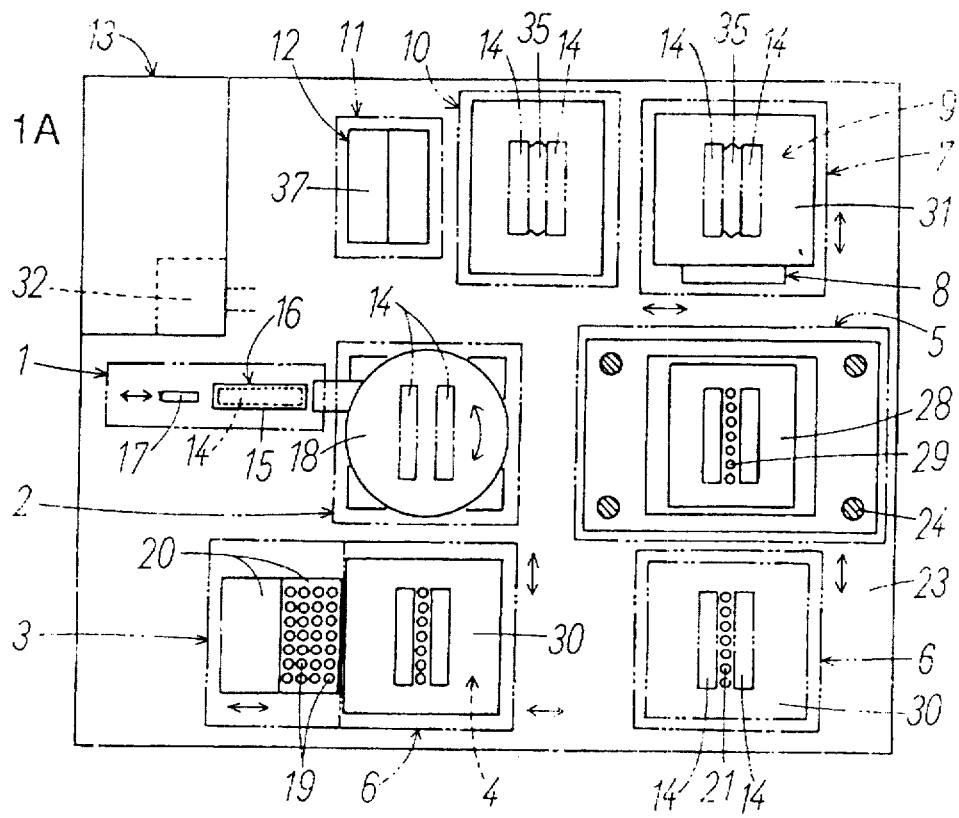
FIGS. 1A and 1B are a schematic plan view and a schematic front elevational view of an apparatus for molding resin to seal electronic parts according to the present invention, showing a combination or configuration of minimum forming units for molding resin to seal electronic parts.
Figure 1B:
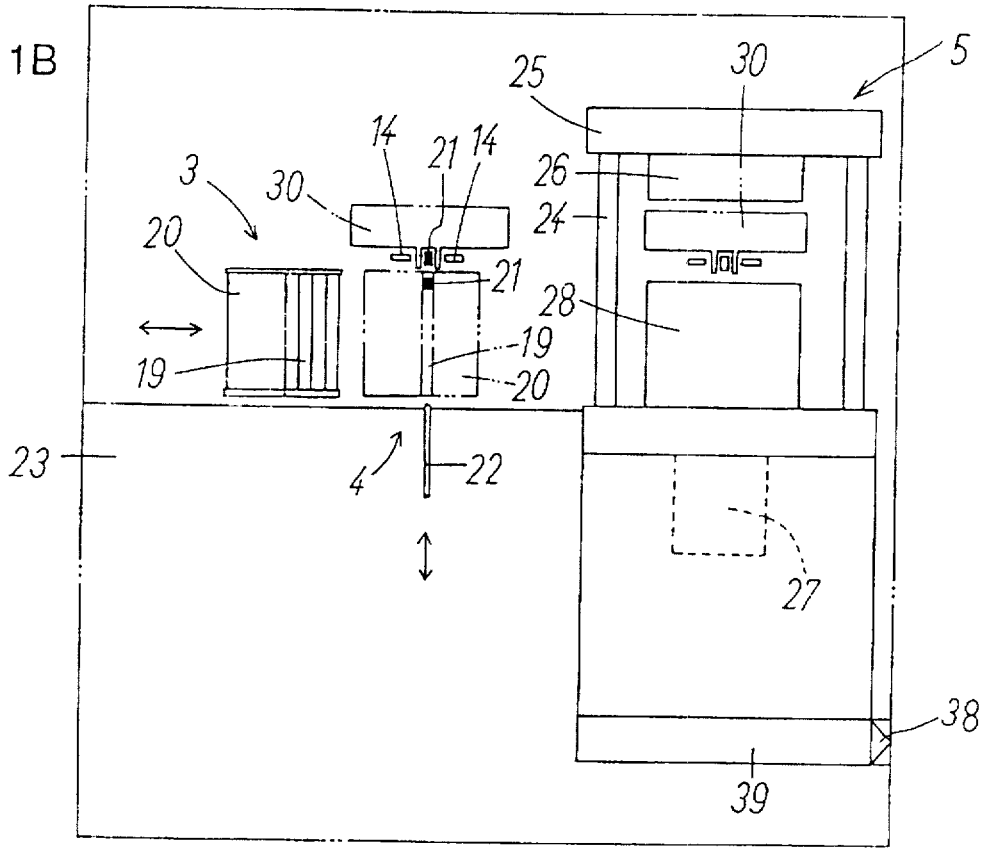

Referring to FIGS. 1A and 1B, an apparatus for molding resin to seal electronic parts according to an embodiment of the present invention comprises a lead frame supply unit 1 for supplying unsealed lead frames having electronic parts mounted thereon, a lead frame aligning unit 2 for aligning the unsealed lead frames with each other along a prescribed direction, a resin tablet supply unit 3 for supplying resin tablets, a resin tablet discharge unit 4 for aligning the resin tablets with each other and discharging the same, a molding unit 5 for molding resin to seal the electronic parts, a loader unit 6 for transferring the lead frames and the resin tablets which are aligned with each other to the molding unit 5, an unloader unit 7 for taking out the sealed lead frames, a cleaner unit 8 for a mold, a transfer unit 9 for transferring the sealed lead frames, a degating unit 10 for removing gates from the sealed lead frames, a pickup unit 11 for picking up the degated sealed lead frames independently of each other, a lead frame storage unit 12 for storing the degated sealed lead frames in respective magazines independently of each other, and a controller unit 13 for continuously and automatically controlling the operations of the aforementioned units.

The aforementioned lead frame supply unit 1 is provided with a set portion 16 for an in-magazine 15 storing a plurality of unsealed lead frames 14 having electronic parts mounted thereon, and a proper pusher mechanism 17 for transferring the unsealed lead frames 14 from the in-magazine 15 to the lead frame aligning unit 2 independently of each other.

The lead frame aligning unit 2 is provided with a proper aligning mechanism 18 for aligning the unsealed lead frames 14 that are received from the lead frame supply unit 1 with each other along a prescribed direction.

While two unsealed lead frames 14 are aligned in parallel with each other and an inverting/aligning mechanism is provided for inverting one of the unsealed lead frames 14 in response to a mold layout structure in the molding unit 5 in FIGS. 1A and 1B, it is not necessary to invert any unsealed lead frame when the mold layout is adapted to supply a single unsealed lead frame 14.

The resin tablet supply unit 3 is provided with resin tablet supply members 19 in a number corresponding to the number of pots provided in the molding unit 5. The resin tablet supply members 19 are arranged in a mode corresponding to the number of the pots provided in the molding unit 5 and intervals therebetween, and integrally stored in a required resin tablet cassette 20, in consideration of convenience in handling. The resin tablet supply members 19 can be appropriately replaced by proper ones when the mold layout is changed in the molding unit 5 in response to the number of new pots and intervals therebetween.

As shown in FIG. 1B the resin tablet discharge unit 4 is provided with a proper pusher mechanism 22 for discharging the resin tablets 21, which are stored in the resin tablet supply members 19 provided in the resin tablet supply unit 3, in alignment with each other.

The molding unit 5 is provided with a fixed plate 25 fixed to an upper part of an apparatus body 23 through tie-bars 24, a fixed upper mold section 26 mounted on the fixed plate 25, a movable lower mold section 28 oppositely arranged under the fixed upper mold section 26 to be vertically driven by a required mold switching or driving mechanism 27, and a plurality of (seven in FIG. 1A) pots 29 arranged on the movable lower mold section 27.

Further, plungers are engaged in the respective pots 29 for pressurizing the resin tablets 21, and heating means such as heaters are provided on the upper and lower mold sections 26 and 28, while required numbers of resin molding cavities are oppositely provided in mold surfaces of the upper and lower mold sections 26 and 28 and resin passages (not shown) are provided between the pots 29 and the cavities.

When the upper and lower mold sections 26 and 28 are closed and the resin tablets 21 provided in the respective pots 29 are heated and pressurized, therefore, molten resin materials can be injected or charged into the respective cavities through the resin passages.

The loader unit 6 is provided with a loader 30 for simultaneously transferring two unsealed lead frames 14, which have been aligned with each other by the lead frame aligning unit 2, and a plurality of (seven in FIG. 1A) resin tablets 21 that are aligned with each other and discharged by the resin tablet discharge unit 4 toward the molding unit 5.

Figure 3:
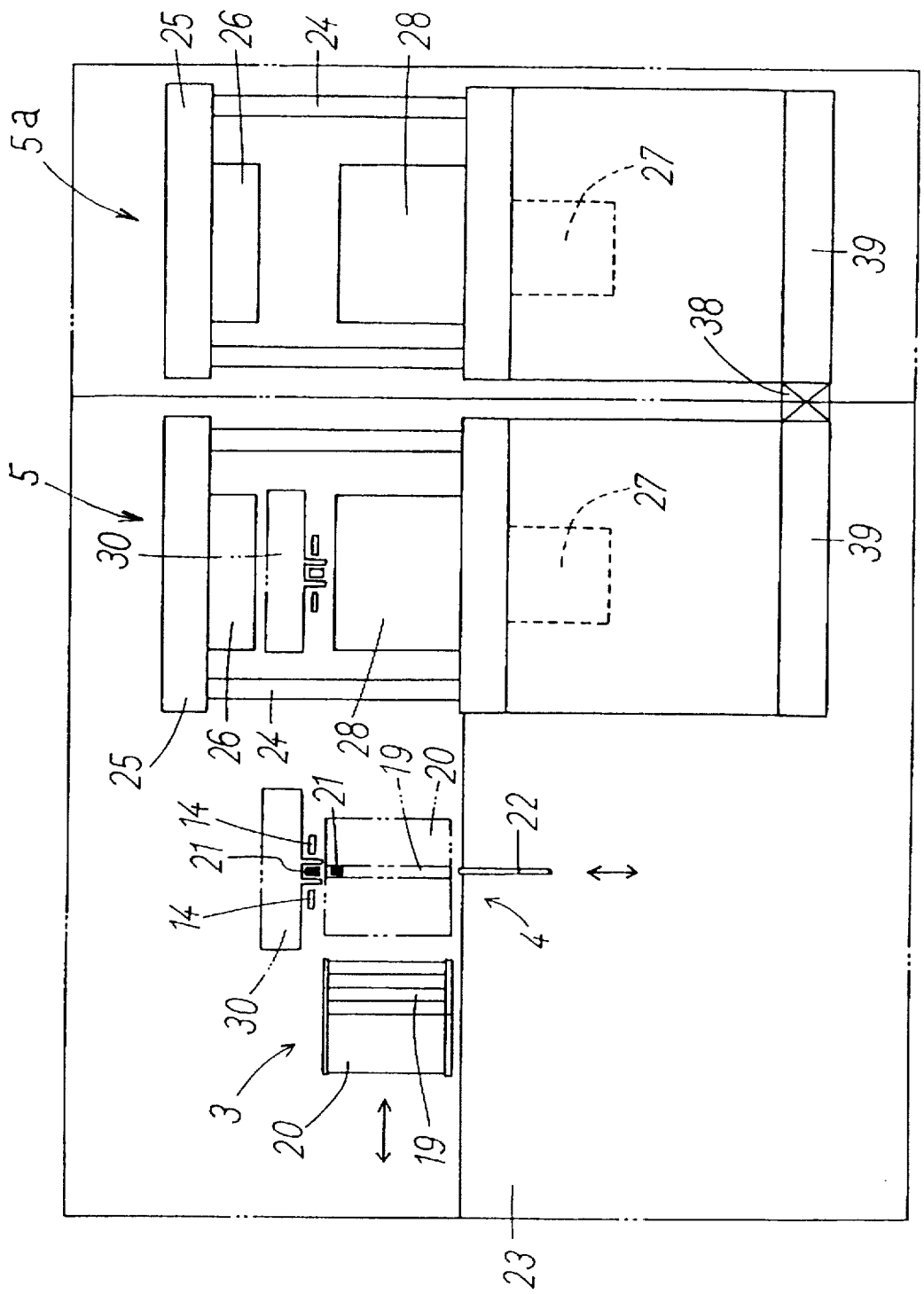
FIG. 3 is a schematic front elevational view of the apparatus for molding resin to seal electronic parts corresponding to FIG. 2.

The loader 30 is adapted to reciprocate between positions of the lead frame aligning unit 2 and the molding unit 5, for picking up two unsealed lead frames 14 through a proper mechanism (not shown) while picking up the respective resin tablets 21 discharged by the resin tablet discharge unit 4 by a proper mechanism (not shown) in the position of the lead frame aligning unit 2 (see FIG. 1A, FIG. 1B, and FIG. 3).

At this time, two unsealed lead frames 14 and the respective resin tablets 21 are picked up by the loader 30 in the same mode or configuration as a mold layout in the molding unit 5. Thus, it is possible to supply two unsealed lead frames 14 and the respective resin tablets 21 into prescribed positions of the cavities and the pots 29, respectively, by transferring the same to positions above the movable lower mold section 28 of the molding unit 5 and releasing the same from the picked-up states.

While it is possible to advantageously simplify the overall structure of the apparatus and to reduce the overall molding time since the loader 30 simultaneously transfers the unsealed lead frames 14 and the respective resin tablets 21, mechanisms for transferring the lead frames 14 and the resin tablets 21 may alternatively be provided and driven independently of each other.

The unloader unit 7 is provided with an unloader 31 for taking out the lead frames 14 which are sealed with molded resin in the molding unit 5 to the exterior of the upper and lower mold sections 26 and 28. This unloader 31 is adapted to reciprocate with respect to the position of the molding unit 5, to be capable of taking out two sealed lead frames 14 and a gate portion integrated therebetween to the exterior, whereby the lead frames and the gate portion are simultaneously picked up by a proper mechanism (not shown).

The cleaner unit 8 is provided with an air blower mechanism for blowing air onto the mold surfaces of the upper and lower mold sections 26 and 28 provided in the molding unit 5, and a vacuum mechanism (not shown) for sucking dust away from the mold surfaces. Further, the cleaner unit 8 is integrated with the unloader 31 of the unloader unit 7. Thus, the cleaner unit 8 is adapted to simultaneously reciprocate with the unloader unit 7 with respect to the position of the molding unit 5.

Further, the cleaner unit 8 is driven when the unloader unit 7 picking up the sealed lead frames 14 is retracted to the exterior, for example, to suck dust away from the mold surfaces by the actions of the air blower and vacuum mechanisms and store the dust in a proper dust collection part 32. Thus, it is possible to simply and efficiently clean the mold surfaces in advance of the next resin molding.

While it is possible to simplify the overall structure of the apparatus and to reduce the overall molding time due to the integrated structure of the unloader unit 7 and the cleaner unit 8, these units 7 and 8 may alternatively be formed independently of each other and may be driven independently of each other.

Further, the cleaner unit 8 may be provided with a brush member for forcibly separating resin flashes that adhere to the mold surfaces and an excitation mechanism for the brush member, for example.

Figure 6A:
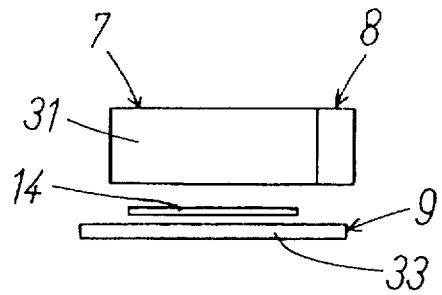
FIGS. 6A to 6D illustrate steps of taking out sealed lead frames and storing the same in stock magazines.
Figure 6B:
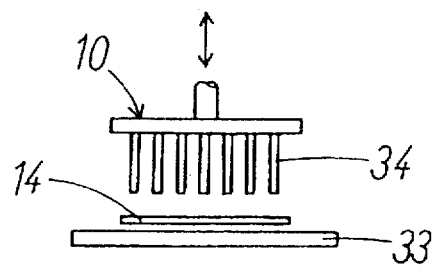
Figure 6C:
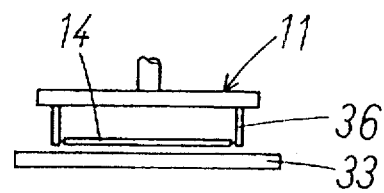
Figure 6D:
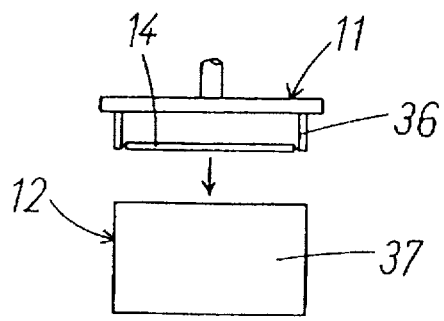

As shown in FIGS. 6A, 6B and 6D, the aforementioned transfer unit 9 for the sealed lead frames 14 is provided with a proper pallet 33 which reciprocates to transfer the sealed lead frames 14, which have been taken out by the unloader unit 7, to positions of the degating unit 10 and the lead frame storage unit 12.

As shown in FIG. 6B, the degating unit 10 is provided with a gate breaking mechanism 34 for removing the gate portion defined between the sealed lead frames 14, which have been transferred by the pallet 33 of the transfer unit 9. This gate breaking mechanism 34 is adapted to pick up two sealed lead frames 14 which are coupled/integrated with each other through a gate portion 35 as shown in FIG. 1A, for example, by a proper mechanism (not shown) and to pressurize the gate portion 35 defined between the lead frames 14 in this state for cutting/removing the same.

As shown in FIGS. 6C and 6D, further, the pickup unit 11 is provided with a pickup mechanism 36 for picking up two sealed lead frames 14, which have been transferred from the degating unit 10 by the pallet 33 of the transfer unit 9 independently of each other. This pickup mechanism 36 can pick up two sealed lead frames 14 transferred by the pallet 33 of the transfer unit 9 independently of each other, as shown in FIG. 6C.

The lead frame storage unit 12 is provided with stock magazines 37 capable of storing, independently of each other, two sealed lead frames 14, which have been independently picked up by the pickup mechanism 36 of the pickup unit 11.

The two sealed lead frames 14, which have been picked up by the pickup mechanism 36 of the pickup unit 11 independently of each other, are relieved or released from the pickup mechanism 36 when the pallet 33 of the transfer unit 9 is retracted to its original position so that the lead frames can be stored independently of each other in the prescribed stock magazines 37 provided thereunder, as shown in FIG. 6D.

The controller unit 13 is adapted to continuously and automatically control the operations of the aforementioned units, for molding resin to seal the electronic parts in the following manner, for example.

Two unsealed lead frames 14 provided in the in-magazine 15 of the lead frame supply unit 1 are transferred by the pusher mechanism 17 toward the lead frame aligning unit 2 independently of each other. Then, the two unsealed lead frames 14 are aligned with each other along the prescribed direction by the aligning mechanism 18 of the lead frame aligning unit 2. Following or in parallel with the aforementioned steps of transferring the two unsealed lead frames 14 and aligning the same with each other, the seven resin tablets 21 are aligned with each other and discharged by the resin tablet supply unit 3 and the resin tablet discharge unit 4.

Then, the two unsealed lead frames 14 provided in the lead frame aligning unit 2 and the seven resin tablets 21 provided in the resin tablet supply unit 3 are transferred to a clearance between the upper and lower mold sections 26 and 28 of the molding unit 5 by the loader 30 of the loader unit 6, and the same are released from the loader 30 so that the unsealed lead frames 14 are supplied into prescribed positions of the cavities provided in the movable lower mold section 28 while the respective resin tablets 21 are supplied into the pots 29.

Then the upper and lower mold sections 26 and 28 are closed by the mold switching mechanism 27 while the resin tablets 21 received in the pots 29 are heated and pressurized to be melted so that molten resin materials are injected and charged into the cavities through the resin passages respectively, for sealing the electronic parts engaged in the cavities respectively.

Then, the lead frames 14 as sealed are taken out from the upper and lower mold sections 26 and 28 of the molding unit 5 to the exterior thereof by the unloader 31 of the unloader unit 7, while the mold surfaces of the upper and lower mold sections 26 and 28 are cleaned by the air blower and vacuum mechanisms of the cleaner unit 8 during retraction of the unloader 31 so that dust is sucked away from the mold surfaces.

Then, the sealed lead frames 14, which have been taken out by the unloader unit 7, are transferred to the position of the degating unit 10 by the pallet 33 of the transfer unit 9. There the gate portion 35 between the sealed lead frames 14 is cut and removed by the gate breaking mechanism 34 of the degating unit 10.

Then, the two sealed lead frames 14, which have been separated from each other by removal of the gate portion 35, are transferred to the position of the lead frame storage unit 12 by the pallet 33 of the transfer unit 9. Then, the two separated sealed lead frames 14 are picked up independently of each other by the pickup mechanism 36 of the pickup unit 11. Then, the pallet 33 of the transfer unit 9 is retracted and the two sealed lead frames 14 are released from the pickup mechanism 36 of the pickup unit 11, to be stored in the respective stock magazines 37 independently of each other.

Engaging means 38 is provided on a right end portion of a bottom base 39 of the molding unit 5, to be coupled with another molding unit as described later.

As hereinabove described, the apparatus shown in FIGS. 1A and 1B is formed by a combination of the minimum forming units necessary for molding resin to seal electronic parts. In this apparatus for molding resin to seal electronic parts, further, the series of steps are continuously and automatically carried out by the controller unit 13.

Figure 2:
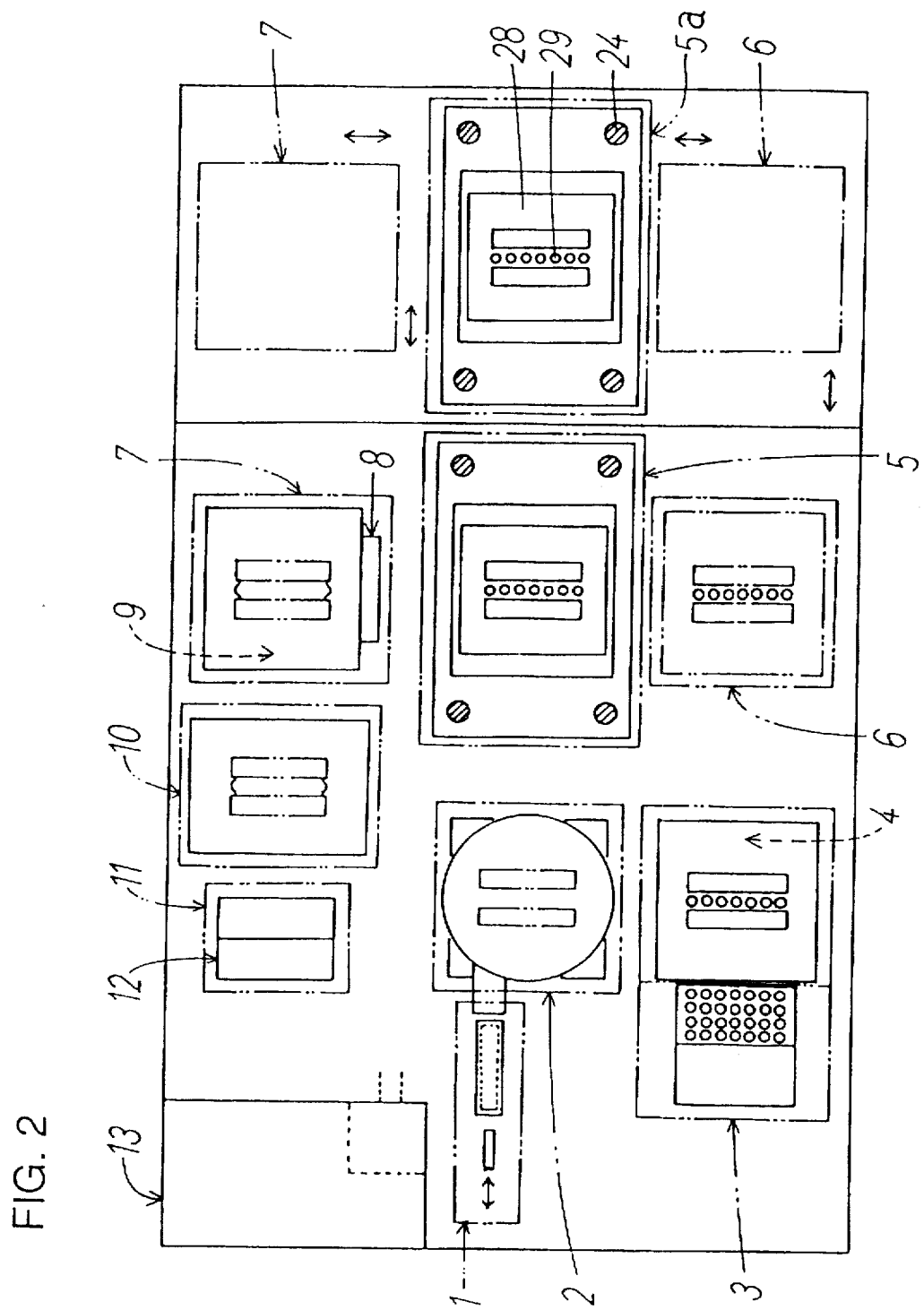
FIG. 2 is a schematic plan view showing the apparatus for molding resin to seal electronic parts shown in FIGS. 1A to 1B, in combination with an additional molding unit.
Figure 4:
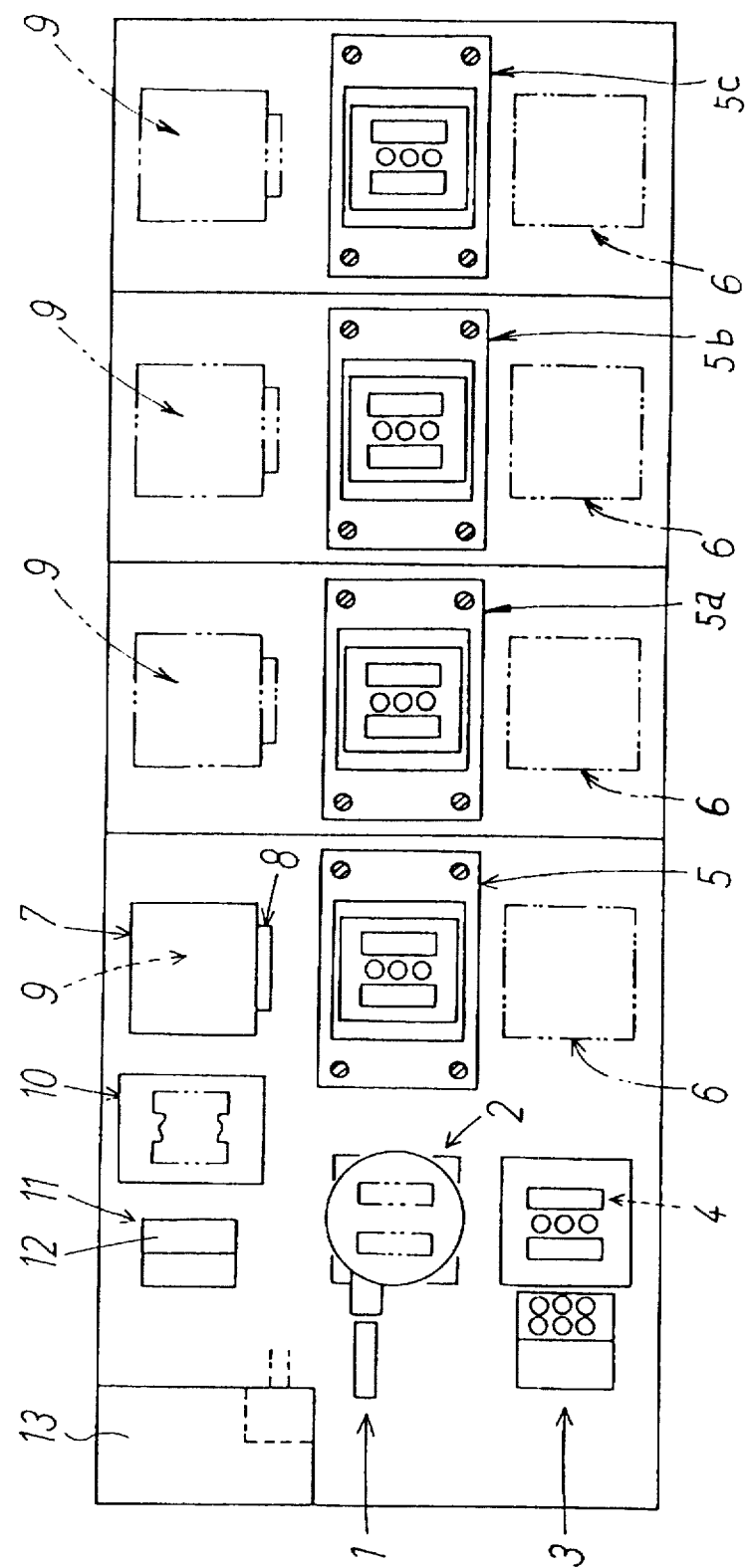
FIG. 4 is a schematic plan view showing the apparatus for molding resin to seal electronic parts shown in FIGS. 1A to 1B, in combination with a plurality of additional molding units.
Figure 5:
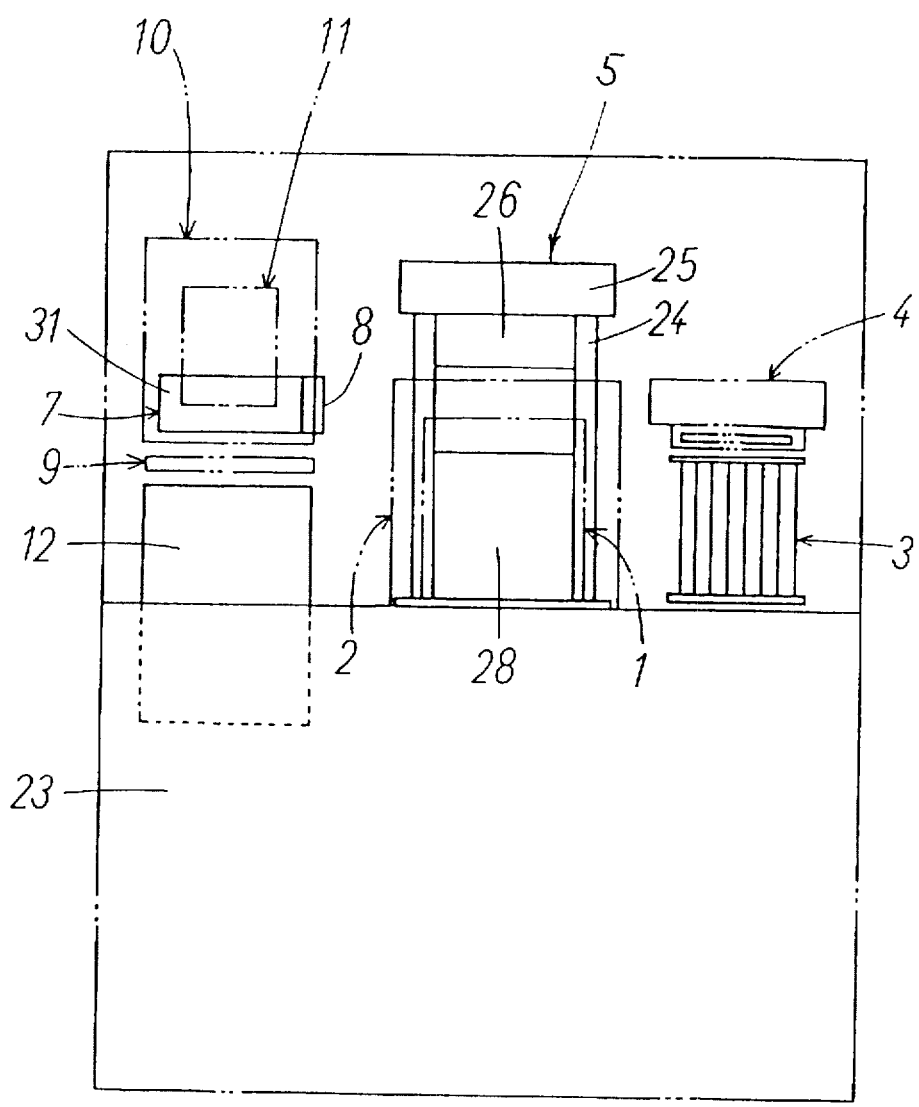
FIG. 5 is a schematic side elevational view of the apparatus for molding resin to seal electronic parts corresponding to FIGS. 1A and 1B.

FIGS. 2 and 3 show the apparatus formed by the combination of the minimum units shown in FIGS. 1A and 1B, further combined with an additional molding unit 5a having the same function as that of the molding unit 5. FIG. 4 shows the apparatus further combined with a plurality of additional molding units 5b and 5c.

The additional molding units 5a, 5b and 5c are identical in structure to the aforementioned molding unit 5, and detachably mountable on a side portion of the molding unit 5 provided in the apparatus formed by the combination of the minimum units shown in FIGS. 1A and 1B.

Therefore, it is possible to form an apparatus for molding resin to seal electronic parts which is responsive to and suitable for mass production with molds substantially increased in size, by successively mounting the additional molding units 5a, 5b and 5c on the side portion of the molding unit 5 of the apparatus formed by the combination of the minimum units shown in FIGS. 1A and 1B.

Namely, it is possible to arbitrarily and simply adjust the number of molding units provided in the aforementioned apparatus in response to the production quantity as required. Thus, it is possible to simply cope with production of sealed electronic parts in small and large quantities as needed.

When the apparatus for molding resin to seal electronic parts is combined with the additional molding units, it is possible to use most of the members provided in the apparatus which is formed by the combination of the minimum units shown in FIGS. 1A and 1B as such. Namely, it is possible to substantially use the unsealed lead frame supply unit 1, the lead frame aligning unit 2, the resin tablet supply unit 3, the resin tablet discharge unit 4, the loader unit 6, the unloader unit 7, the cleaner unit 8, the transfer unit 9, the degating unit 10, the pickup unit 11, the lead frame storage unit 12 and the controller unit 13 as such, simply by changing control conditions by the controller unit 13 in response to the number of the molding units as employed.

Figure 7:
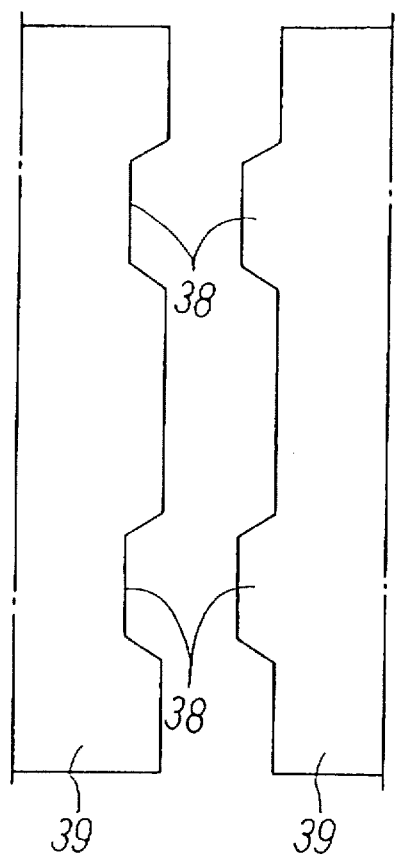
FIG. 7 is a schematic plan view showing a coupling portion between the apparatus for molding resin to seal electronic parts shown in FIGS. 1A to 1B and another molding unit, and engaging means in the coupling portion between the molding units.

The engaging means 38 is provided between the molding unit 5 of the apparatus for molding resin to seal electronic parts which is formed by the combination of the minimum units shown in FIGS. 1A and 1B and the additional molding unit 5a which is coupled with or detached from the molding unit 5, for simply and reliably positioning the molding units 5 and 5a and coupling the same with each other. The engaging means 38 may be formed by irregular engaging parts which are formed on bottom bases 39 of the molding units 5 and 5a as shown in FIGS. 3 and 7, for example.

In the mode shown in FIGS. 2 to 4, the apparatus for molding resin to seal electronic parts is adapted to mold resin for simultaneously sealing the same type of products through steps which are basically identical to those in the mode shown in FIGS. 1A and 1B, with addition of the following steps.

In addition to the steps carried out in the apparatus which is formed by the combination of the minimum units, the same type of products are sealed in the additional molding units 5a, 5b and 5c through a step of transferring unsealed lead frames 14 and resin tablets 21 from the lead frame aligning unit 2 and the resin tablet supply unit 3 to the additional molding units 5a, 5b and 5c, and setting the same in prescribed positions with the loader unit 6; a step of molding resin to seal electronic parts in the additional molding units 5a, 5b and 5c; a step of taking out the lead frames 14 as sealed by the unloader unit 7; a step of cleaning the mold surfaces by the cleaner unit 8; a step of transferring the sealed lead frames 14 to the position of the degating unit 10 by the transfer unit 9; a step of cutting/removing gate portions 35 defined between the sealed lead frames 14 by the degating unit 10; a step of transferring the degated sealed lead frames 14 to the position of the lead frame storage unit 12 by the transfer unit 9; a step of picking up the sealed lead frames 14 from the position of the lead frame storage unit 12 by the pickup unit 11; and a step of storing the sealed lead frames 14 picked up by the pickup unit 11 in the stock magazines 37.

In the just described process, most of the members provided in the apparatus which is formed by the combination of the minimum units shown in FIGS. 1A and 1B are used as such as described above. Therefore, periods for starting steps of molding resin to seal electronic parts in the respective molding units 5, 5a, 5b and 5c may be set at prescribed time intervals.

Also when the molding units 5, 5a, 5b and 5c are different from each other in mold layout in the apparatus which is provided with the additional molding units 5a, 5b and 5c as shown in FIGS. 2 to 4 for molding different types of products in the molding units 5, 5a, 5b and 5c, it is possible to use most of the units provided in the apparatus shown in FIGS. 1A and 1B as such.

In this case, the unsealed lead frame supply unit 1 may be provided with in-magazines 15 in a number corresponding to that of the different mold layouts, while the lead frame storage unit 12 may be provided with stock magazines 37 in a number corresponding to that of the in-magazines 15. When the numbers of the pots 29 provided in the molding units 5, 5a, 5b and 5c and the numbers and shapes of the lead frames 14 are different from each other, the respective corresponding units may be provided with functions or structures which are changeable/adjustable in response thereto, in addition to the in-magazines 15 and the stock magazines 37 being provided in numbers corresponding to that of the different mold layouts. For example, the resin tablet supply unit 3, the resin tablet discharge unit 4, the loader unit 6, the unloader unit 7, the degating unit 10 and the pickup unit 11 may be provided with functions which are changeable/adjustable in correspondence to the changes in the number of the pots 29 and in the number and shape of the lead frames 14. Alternatively, the additional molding units 5a, 5b and 5c may be provided with dedicated loader units, dedicated unloader units, dedicated degating units and dedicated pickup units respectively.

While the additional molding units 5a, 5b and 5c are identical to the molding unit 5, the mold layouts thereof may be different from each other in response to the compacts that are to be formed, for manufacturing different types of compacts in the molding units 5, 5a, 5b and 5c. Further, the additional molding units 5a, 5b and 5c can be detachably mounted on the side portion of the molding unit 5 provided in the apparatus for molding resin to seal electronic parts which is formed by the combination of the minimum units shown in FIGS. 1A and 1B.

Therefore, it is possible to simply form an apparatus for molding resin to seal electronic components substantially comprising a plurality of molds by successively mounting the additional molding units 5a, 5b and 5c on the apparatus for molding resin to seal electronic parts which is formed by the combination of the minimum units. On the other hand, it is also possible to form an apparatus for molding resin to seal electronic parts having a substantially small number of mold(s) by successively removing the additional molding units 5a, 5b and 5c or stopping operations thereof. In other words, the number of the molding units can be arbitrarily and simply adjusted in the aforementioned apparatus in response to the required production quantity, whereby it is possible to simply and quickly cope with a case of simultaneously manufacturing different types of products in small or large quantities and also a case of simultaneously manufacturing the same type of products in small or large quantities.

When the apparatus for molding resin to seal electronic parts in the mode shown in FIGS. 2 to 4 is adapted to simultaneously form different types of products, steps of forming additional products in the additional molding units 5a, 5b and 5c may be added to the aforementioned steps that are carried out in the apparatus formed by the combination of the minimum units for molding resin to seal electronic parts.

When the aforementioned steps of molding resin to seal electronic parts are continuously and automatically carried out, it is possible to produce sealed compacts of electronic parts with high efficiency while reducing the overall molding time, by carrying out the aforementioned steps of supplying and taking out the respective members and cleaning the mold surfaces in parallel with each other.

The resin tablet supplying step of transferring the resin tablets 21 into the clearance between the upper and lower mold sections 26 and 28 provided in the molding unit 5 and supplying the same into the pots 29 provided in the lower mold section 28 is carried out in parallel with the unsealed lead frame supplying step of transferring unsealed lead frames 14 into the clearance between the upper and lower mold sections 26 and 28 provided in the molding unit 5 and supplying the unsealed lead frames 14 into the prescribed positions of the cavities provided in the upper and lower mold sections 26 and 28, so that these steps can be carried out substantially in a single step time, whereby the overall molding time is reduced.

Further, it is possible to reduce the overall molding time by carrying out the sealed lead frame takeout step of advancing the unloader unit 7 into the clearance between the upper and lower mold sections 26 and 28, engaging the sealed lead frames 14 and retracting the unloader unit 7 in this state for taking out the sealed lead frames 14 to the exterior of the upper and lower mold sections 26 and 28 simultaneously with the step of cleaning the mold surfaces of the upper and lower mold sections 26 and 28. In this case, the mold surface cleaning step can be carried out simultaneously with the retraction of the unloader unit 7, whereby these steps can be carried out substantially in a single step time.

In addition, a step of supplying unsealed lead frames 14 that are to be subsequently sealed to the prescribed positions of the cavities provided in the upper and lower mold sections 26 and 28 by advancing the loader unit 6 into the clearance between the upper and lower mold sections 26 and 28 can be carried out, as mentioned above, during the retraction of the unloader unit 7.

Further, a resin tablet supplying step of supplying the resin tablets 21 that are to be employed for the next sealing operation into the pots 29 of the lower mold section 28 can be carried out simultaneously with the aforementioned advancement of the loader unit 6. Namely, it is possible to substantially simultaneously carry out the advancement of the loader unit 6 during the retraction of the unloader unit 7 and the steps of supplying the unsealed lead frames 14 and the resin tablets 21 by means of the loader unit 6. Thus, it is possible to further reduce the overall molding time by substantially simultaneously carrying out the sealed lead frame takeout step, the mold surface cleaning step, the unsealed lead frame supplying step and the resin tablet supplying step in parallel with each other within a short time.

As hereinabove described, it is possible to carry out the unsealed lead frame supplying step and the resin tablet supplying step with the sealed lead frame takeout step while carrying out the mold surface cleaning step. Thus, it is possible to reduce the overall molding time by substantially simultaneously carrying out the sealed lead frame takeout step, the mold surface cleaning step, the unsealed lead frame supplying step and the resin tablet supplying step in parallel with each other.

The aforementioned embodiment is adapted to take out the sealed lead frames from the upper and lower mold sections 26 and 28 to the exterior by the unloader 31 while cleaning the mold surfaces of the upper and lower mold sections 26 and 28 by sucking dust away from the mold surfaces through the air blower and vacuum mechanisms provided in the cleaner unit 8 during retraction of the unloader 31. Further, the embodiment is also adapted to substantially simultaneously carry out the unsealed lead frame and resin tablet supplying steps by the loader unit 6 during retraction of the unloader 31.

Namely, the steps of supplying the unsealed lead frames and the resin tablets are simultaneously carried out with the mold surface cleaning step of retracting the unloader 31 in this case. According to this embodiment, therefore, it is possible to substantially simultaneously carry out the sealed lead frame takeout step, the mold surface cleaning step, the unsealed lead frame supplying step and the resin tablet supplying step in parallel with each other within a short time.

However, if the unsealed lead frames 14 may be soiled by dust on the mold surfaces in an actual operation due to the aforementioned simultaneous performance of the steps of supplying the unsealed lead frames 14 and the resin tablets 21 with the mold surface cleaning step, for example, the unsealed lead frame and resin tablet supplying steps may be continuously carried out following the mold surface cleaning step, to solve this problem. While the unsealed lead frame and resin tablet supplying steps cannot be simultaneously carried out with the mold surface cleaning step in this case, it is possible to minimize the loss of molding time as well as to form products having high quality and high reliability by carrying out the unsealed lead frame and resin tablet supplying steps immediately after the mold surface cleaning step.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of molding resin for sealing electronic parts mounted on lead frames with a resin material, using a molding apparatus including at least a first molding unit having a mold, a mold driving unit connected to said mold and adapted to open and close said mold, resin supply pots arranged in said mold, resin pressurizing plungers provided on said pots, cavities provided in mold surfaces of said mold, and resin passages provided between said cavities and said pots, said method comprising:

a step of adjusting the number of molding units included in said molding apparatus by detachably mounting an additional second molding unit with respect to said first molding unit;

a step of supplying unsealed lead frames having electronic parts mounted thereon and resin tablets into each said molding unit;

a step of molding resin to seal said electronic parts in each said molding unit; and a step of removing said sealed electronic parts from each said molding unit.

2. The method of claim 1, wherein said step of supplying said unsealed lead frames having electronic parts mounted thereon and said resin tablets into each said molding unit includes:

a step of supplying and setting a number of said unsealed lead frames having electronic parts mounted thereon in prescribed positions of a lead frame supply unit, a step of transferring said unsealed lead frames, which have been set in said lead frame supply unit, to a lead frame aligning unit, a step of aligning said unsealed lead frames, which have been transferred to said lead frame aligning unit, with each other along a prescribed direction, a step of supplying a prescribed number of said resin tablets into a resin tablet discharge unit and aligning said resin tablets with each other, and a step of transferring said unsealed lead frames, which have been set in said lead frame aligning unit, and said resin tablets, which have been aligned with each other in said resin tablet discharge unit, into a clearance between a fixed mold section and a movable mold section in each said molding unit while supplying said unsealed lead frames into prescribed positions of said cavities in each said molding unit and supplying resin tablets into said pots, wherein said step of molding resin to seal said electronic parts includes:

a step of closing said fixed mold section and said movable mold section by means of said mold driving unit while heating, pressurizing and melting said resin tablets in said pots for injecting molten resin materials into said cavities through said resin passages thereby engaging said electronic parts in said cavities and molding said resin materials to seal said electronic parts that have been engaged in said cavities, and wherein said step of removing said sealed electronic parts from each said molding unit includes:

a step of removing said sealed lead frames from said fixed mold section and said movable mold section, a step of cleaning mold surfaces of said fixed mold section and said movable mold section, a step of transferring said sealed lead frames to a position of a degating unit, a step of removing gate portions from said sealed lead frames in said degating unit, a step of transferring said sealed lead frames to a lead frame storage unit after said step of removing said gate portions, a step of picking up said sealed lead frames in said lead frame storage unit independently of each other, and a step of storing said sealed lead frames that have been picked up independently of each other.

3. The method of claim 1, wherein said first molding unit and said additional second molding unit are adapted to mold resin for sealing products of types that are different from each other, and said step of molding resin to seal said electronic parts in said molding units includes a step of simultaneously sealing said products of different types with molded resin in parallel with each other.

4. A method of molding resin to seal electronic parts, comprising:

(a) transferring unsealed lead frames into a clearance between an upper mold section and a lower mold section in a molding unit for supplying said unsealed lead frames to prescribed positions of cavities in said upper and lower mold sections;

(b) transferring resin tablets into said clearance between said upper and lower mold sections in said molding unit and supplying said resin tablets into pots that are provided in said lower mold section;

(c) closing said upper and lower mold sections in said molding unit and engaging said lead frames in said cavities;

(d) heating, pressurizing and melting said resin tablets that have been supplied into said pots and injecting molten resin materials into said cavities through resin passages that are provided between said pots and said cavities, thereby molding said resin materials to seal electronic parts mounted on said lead frames that have been engaged in said cavities;

(e) removing said sealed lead frames from said upper and lower mold sections; and (f) cleaning respective mold surfaces of said upper and lower mold sections;

wherein said step (f) is simultaneously carried out in parallel with said step (e), and said steps (a) and (b) are simultaneously carried out in parallel with said step (e).

5. The method of claim 4, wherein said step (e) includes a step of advancing an unloader unit into said clearance between said upper and lower mold sections and engaging said sealed lead frames with said unloader unit, and retracting said unloader unit with said engaged sealed lead frames for removing said sealed lead frames from said upper and lower mold sections, said step (a) includes a step of advancing a loader unit into said clearance between said upper and lower mold sections during said retracting of said unloader unit for carrying out said supplying of said unsealed lead frames in prescribed positions of said cavities in said upper and lower mold sections, said step (b) includes a step of advancing said loader unit into said clearance between said upper and lower mold sections during said retracting of said unloader unit for carrying out said supplying of said resin tablets into said pots, and said step (f) includes a step of moving a cleaner unit along said mold surfaces of said upper and lower mold sections for cleaning said mold surfaces of said upper and lower mold sections.

6. The method of claim 5, wherein said steps (a) and (b) are simultaneously carried out during said advancing of said loader unit into said clearance between said upper and lower mold sections.

7. The method of claim 5, wherein said step (f) is carried out with said cleaner unit during said retracting of said unloader unit.

8. The method of claim 5, wherein said cleaner unit is mounted on said unloader unit, and wherein said step (f) is carried out by retracting said cleaner unit together with said unloader unit during said retracting of said unloader unit in said step (e).

9. A method of molding resin to seal parts in said resin using a molding apparatus that includes a first molding unit and selectively includes at least one removably mountable second molding unit, wherein each said molding unit respectively includes a mold, a resin supply pot arranged in said mold, a resin pressurizing plunger arranged in said pot, a mold cavity provided in a mold surface of said mold, a resin passage communicating said pot with said cavity, and a driving unit connected to said mold for opening and closing said mold, said method comprising:

(a) determining a number of said second molding units that are to be used for a molding run;

(b) configuring said molding apparatus by removably mounting said number of said second molding units together with said first molding unit in said apparatus;

(c) supplying at least one of said parts to each said molding unit;

(d) supplying at least one tablet of said resin to each said molding unit;

(e) melting said at least one resin tablet and molding said resin to seal said at least one part in said resin in each said molding unit; and (f) removing said at least one sealed part from each said molding unit.

10. The method of claim 9, further comprising repeating said steps (a) to (f) for a subsequent molding run, wherein said repeated step (b) comprises reconfiguring said molding apparatus by removably mounting a different number of said second molding units in said apparatus.

11. The method of claim 10, wherein said reconfiguring of said molding apparatus involves removing said number of said second molding units, and said steps (c) to (f) are carried out with only said first molding unit.

12. The method of claim 9, wherein said number of said second molding units that are removably mounted in said step (b) is more than one.

13. The method of claim 9, wherein said parts that are to be resin sealed in said molding run include at least two types of parts having different shapes or sizes, and wherein said molds of said molding units include at least two types of molds having different shapes or sizes of said mold cavities.

14. The method of claim 9, wherein said molding apparatus further includes a loader unit and an unloader unit that are both arranged to be movable into cooperation with each said molding unit, wherein said steps (c) and (d) comprise moving said loader unit successively into cooperation with each said molding unit and supplying said at least one part and said at least one resin tablet from said loader unit successively to each said molding unit, and wherein said step (f) comprises moving said unloader unit successively into cooperation with each said molding unit and removing said at least one sealed part successively from each said molding unit with said unloader unit.

15. The method of claim 9, further comprising a step of cleaning said mold cavity of each said molding unit in succession, wherein said steps (c), (d) and (f) are carried out for each said molding unit in succession, and wherein said steps (c), (d) and (f) and said step of cleaning said mold cavity are carried out simultaneously with each other for each said molding unit in succession.

16. A method of molding resin to seal a part in said resin using a molding unit including an upper mold section and a lower mold section with a mold cavity in at least one of said upper mold section and said lower mold section and a resin pot in said lower mold section, and a resin passage communicating said resin pot with said cavity, said method comprising:

(a) opening said mold to form a clearance between said lower mold section and said upper mold section;

(b) moving said part into said clearance into a position at said cavity;

(c) moving a tablet of said resin into said clearance and into said pot;

(d) closing said molding unit to close said clearance between said lower mold section and said upper mold section and engage said part in said cavity;

(e) melting and pressurizing said resin tablet in said pot and injecting melted resin through said resin passage into said cavity to mold and seal said part in said melted resin;

(f) removing said sealed part from said cavity; and (g) cleaning a mold surface of said cavity;

(h) repeating said steps (a) to (g) in a subsequent molding cycle in such a manner that said steps (b) and (c) of said subsequent molding cycle and said steps (f) and (g) of an immediately preceding molding cycle are carried out simultaneously with each other.

17. The method of claim 16, wherein said steps (b) and (c) comprise moving a loader unit carrying said part and said resin tablet into and then retracting said loader unit from said clearance from a first side of said molding unit, said step (f) comprises moving an unloader unit into and then retracting said unloader unit from said clearance from a second side of said molding unit opposite said first side, and said step (g) comprises moving a cleaner unit into and then retracting said cleaner unit from said clearance.

18. The method of claim 17, wherein said cleaner unit moves into and is retracted from said clearance from said second side of said molding unit together with said unloader unit, and said loader unit is moved into said clearance from said first side while said unloader unit and said cleaner unit are retracted from said clearance from said second side.

* * * * *